United States Patent
Chang

(10) Patent No.: US 11,005,502 B2
(45) Date of Patent: May 11, 2021

(54) ITERATIVE DECODING CIRCUIT AND DECODING METHOD

(71) Applicant: Realtek Semiconductor Corp., HsinChu (TW)

(72) Inventor: Che-Chia Chang, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 16/780,919

(22) Filed: Feb. 4, 2020

(65) Prior Publication Data
US 2021/0058098 A1    Feb. 25, 2021

(30) Foreign Application Priority Data

Aug. 19, 2019    (TW) ................................ 10812942.9

(51) Int. Cl.
*H03M 13/29*        (2006.01)
*H03M 13/27*        (2006.01)
*H03M 13/41*        (2006.01)

(52) U.S. Cl.
CPC ... *H03M 13/2936* (2013.01); *H03M 13/2732* (2013.01); *H03M 13/2948* (2013.01); *H03M 13/4146* (2013.01)

(58) Field of Classification Search
CPC ................................................ H03M 13/2936
See application file for complete search history.

(56) References Cited

U.S. PATENT DOCUMENTS

| | | | | |
|---|---|---|---|---|
| 6,397,358 | B1* | 5/2002 | Burton | H04L 1/0054 |
| | | | | 714/705 |
| 6,606,724 | B1* | 8/2003 | Krieger | H03M 13/09 |
| | | | | 714/755 |
| 7,783,963 | B2* | 8/2010 | Huggett | H03M 13/3994 |
| | | | | 714/795 |
| 7,836,471 | B2* | 11/2010 | Cho | H04N 7/20 |
| | | | | 725/68 |
| 10,644,837 | B2* | 5/2020 | Serbetli | H03M 13/2948 |
| 2009/0055706 | A1* | 2/2009 | Lin | G06F 11/1072 |
| | | | | 714/758 |

* cited by examiner

*Primary Examiner* — Joseph D Torres
(74) *Attorney, Agent, or Firm* — Winston Hsu

(57) ABSTRACT

An iterative decoding circuit is provided. The iterative decoding circuit includes a first concatenated decoding circuit, a second concatenated decoding circuit, and a comparator. The first concatenated decoding circuit includes a first convolutional decoder, a first deinterleaver, and a first block decoder. The second concatenated decoding circuit is coupled to the first concatenated decoding circuit, and the second concatenated decoding circuit includes a second convolutional decoder, a second deinterleaver, and a second block decoder. The comparator receives a first convolutional decoding result corresponding to a first convolutional decoding operation and a second convolutional decoding result of a second convolutional decoding operation, and is configured to compare the first convolutional decoding result with the second convolutional decoding result to generate a comparing result. The second block decoder obtains an erasure address information according to the comparing result.

20 Claims, 3 Drawing Sheets

ITERATIVE DECODING CIRCUIT AND DECODING METHOD

BACKGROUND OF THE INVENTION

1. Field of the Invention

The present disclosure relates to an iterative decoding circuit and a decoding method, and more particularly, an iterative decoding circuit, and a decoding process with small-area and better error-correction capability.

2. Description of the Prior Art

The limit of the concatenated code can be near the Shannon Limit. The concatenated code combining the convolutional code and the Reed-Solomon code is used to the application of digital video broadcasting (DVBT) and integrated digital service broadcasting (ISDB-T).

In concatenated code, in order to against the burst noise, the different data bytes in a block would be interleaved by an interleaver coupled between the Reed-Solomon encoder and convolutional encoder, and be convolutional encoded. In addition, the property of the error correction of Reed-Solomon code is that the block is corrected when errors are less than or equal to t. In addition, if Reed-Solomon decoder can obtain the erasure position/address (representing that the error occurs in a known position) information, the error correction capability of Reed-Solomon decoder could be improved to (2e+r≤2t, where e is the number of errors, r is the number of erasures, and t is the error correction capability).

A Soft-Output Viterbi Algorithm (SOVA) decoder is often used as a conventional convolutional decoder, generating the log-likelihood ratio (LLR) of each bit, and predicting the erasure position/address according to the values of the log-likelihood ratios. However, the circuit area is large for a SOVA decoder.

Therefore, how to improve the error correction capability of Reed Solomon code by circuit with small area is a significant objective in the field.

SUMMARY OF THE INVENTION

It is therefore a primary objective of the present disclosure to provide an iterative decoding circuit and a decoding process with small-area and better error-correction capability.

An embodiment of the present disclosure provides an iterative decoding circuit. The iterative decoding circuit includes a first concatenated decoding circuit, a second concatenated decoding circuit, and a comparator. The first concatenated decoding circuit includes a first convolutional decoder, a first deinterleaver, and a first block decoder, in which the first convolutional decoder is configured to perform a first convolutional decoding operation. The second concatenated decoding circuit is coupled to the first concatenated decoding circuit, and the second concatenated decoding circuit includes a second convolutional decoder, a second deinterleaver, and a second block decoder, in which the second convolutional decoder is configured to perform a second convolutional decoding operation. The comparator receives a first convolutional decoding result corresponding to the first convolutional decoding operation and a second convolutional decoding result of the second convolutional decoding operation, and is configured to compare the first convolutional decoding result with the second convolutional decoding result to generate a comparing result. The second block decoder obtains an erasure address information according to the comparing result.

An embodiment of the present disclosure further provides a decoding method applied to an iterative decoding circuit. The decoding method includes the following steps: performing a first convolutional decoding operation; generating a first convolutional decoding result corresponding to the first convolutional decoding operation; performing a second convolutional decoding operation, and generating a second convolutional decoding result; comparing the first convolutional decoding result with the second convolutional decoding result to generate a comparing result; and obtaining an erasure address information according to the comparing result.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
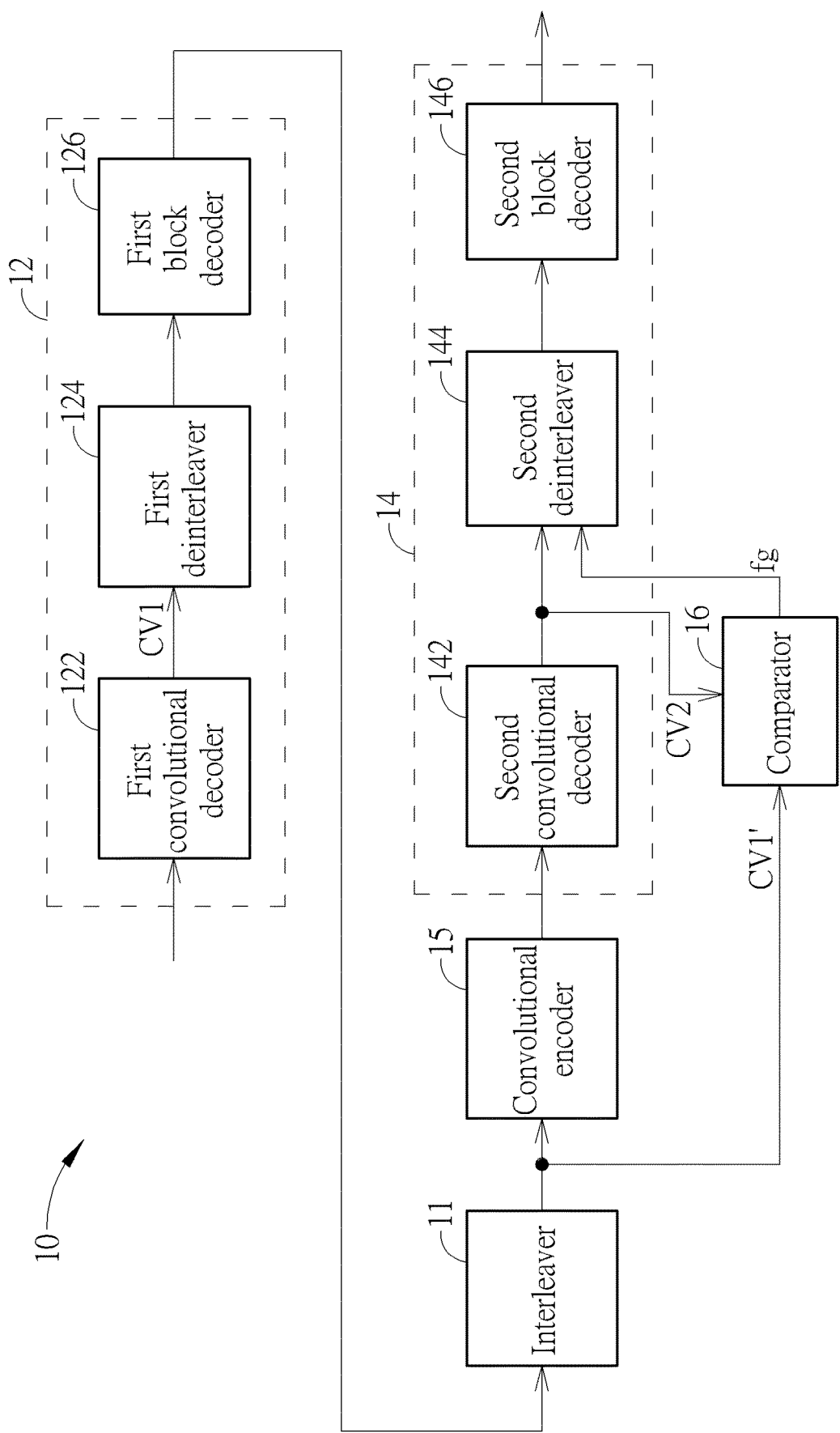
FIG. 1 is a schematic diagram of an iterative decoding circuit according to an embodiment of the present disclosure.

FIG. 1 is a schematic diagram of an iterative decoding circuit 10 according to an embodiment of the present disclosure. The iterative decoding circuit 10, disposed within a receiver in a digital communication system, is configured to perform a decoding operation on a concatenated code. In an embodiment, the digital communication system may be Digital Video Broadcasting (DVB), Integrated Services Digital Broadcasting (ISDB), or Long Term Evolution (LTE). In an embodiment, an outer code of the concatenated code may be a Reed-Solomon code which is a block code, and an inner code of the concatenated code may be a convolutional code.

The iterative decoding circuit 10 comprises a first concatenated decoding circuit 12, an interleaver 11, a convolutional encoder 15, a second concatenated decoding circuit 14 and a comparator 16. The first concatenated decoding circuit 12 comprises a first convolutional decoder 122, a first deinterleaver 124, and a first block decoder 126. The second concatenated decoding circuit 14 comprises a second convolutional decoder 142, a second deinterleaver 144, and a second block decoder 146. In some embodiments, the convolutional decoders 122 and 142 may be Viterbi decoders, and the block decoders 126 and 146 may be Reed-Solomon decoders. In addition, the operations of the Viterbi decoder and the Reed-Solomon decoder are known in the art and shall be omitted herein.

The first convolutional decoder 122 is configured to perform a first convolutional decoding operation. The second convolutional decoder 142 is configured to perform a second convolutional decoding operation. The comparator 16 receives a first convolutional decoding result CV1' corresponding to the first convolutional decoding operation and a second convolutional decoding result CV2 corresponding to the second convolutional decoding operation, compares the first convolutional decoding result CV1' with the second convolutional decoding result CV2 to generate a comparing result fg, and sends the comparing result fg to the second block decoder 146 (via the second deinterleaver 144).

In the embodiment illustrated by FIG. 1, the comparator 16 receives the first convolutional decoding result CV1' via the interleaver 11, and the first convolutional decoding result CV1' outputted by the interleaver 11 is equal to a first convolutional decoding result CV1 generated by the first concatenated decoding circuit 12 because the interleaver 11 can compensate the effect of the first deinterleaver 124, such that the first decoding result CV1' is equal to the first decoding result CV1.

In addition, the second convolutional decoding result CV2 may comprise the convolutional decoded data corresponding to a data block or to a specific data length (e.g., a byte). The comparing result fg may comprise information about the convolutional decoded data corresponding to the data block or the specific data length (e.g., the byte) in the second convolutional decoding result CV2 being correct or needed to be erased (i.e., the error in known position).

Generally, the comparing result fg may comprise binary data. When the first convolutional decoding result CV1' is the same as second convolutional decoding result CV2, the comparing result fg can be 0, representing that the second convolutional decoding result CV2 is correct (or the level of correctness of the second convolutional decoding result CV2 is high). When the first convolutional decoding result CV1' and second convolutional decoding result CV2 are different, the comparing result fg can be 1, representing that the second convolutional decoding result CV2 is incorrect or needed to be erased (or the level of correctness of the second convolutional decoding result CV2 is low). The second block decoder 146 can obtain an erasure address information ESI needed for the block decoding operation according to the comparing result fg.

For example, the first convolutional decoding result CV1' may comprise a first convolutional decoded data CV1'_i corresponding to the specific data block (e.g., a byte i), and the first convolutional decoded data CV1'_i comprises the first decoded bits $cb1'_{0,i}$-$cb1'_{7,i}$. The second convolutional decoding result CV2 may comprise a second convolutional decoded data CV2_i corresponding to the specific data block (e.g., the byte i), and the second convolutional decoded data CV2_i comprises the second decoded bits $cb2_{0,i}$-$cb2_{7,i}$. The comparator 16 may compare the first decoded bits $cb1'_{0,i}$-$cb1'_{7,i}$ with the second decoded bits $cb2_{0,i}$-$cb2_{7,i}$, and output comparing sub-results fg_i_0-fg_i_7 corresponding to bits $b_{0,i}$-$b_{7,i}$ within the byte i, and the second block decoder 146 can obtain an erasure address information ESI according to the comparing sub-results fg_i_0-fg_i_7.

Figure 2:
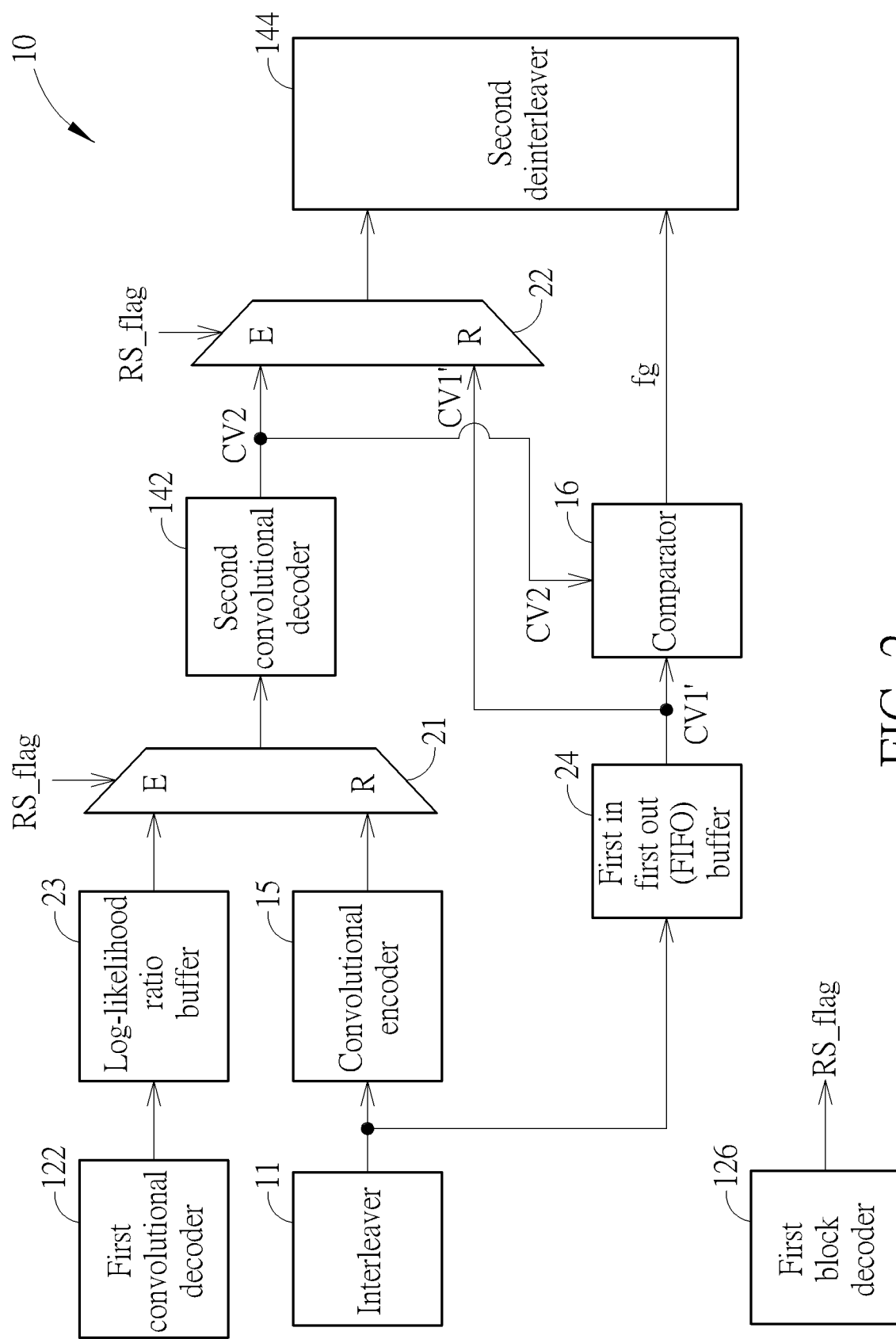
FIG. 2 is a schematic diagram of the iterative decoding circuit according to FIG. 1.

FIG. 2 illustrates a schematic diagram of components between the interleaver 11 and second deinterleaver 144 in the iterative decoding circuit 10. As shown in FIG. 2, the iterative decoding circuit 10 also comprises multiplexers 21 and 22, a log-likelihood ratio (LLR) buffer 23 and a first-in-first-out (FIFO) buffer 24. The log-likelihood ratio buffer 23 is coupled to the first convolutional decoder 122, which is configured to buffer a plurality of log-likelihood ratios $LLR_0$-$LLR_M$ corresponding to a plurality of bits $b_0$-$b_M$.

Multiplexing input terminals of the multiplexer 21 are coupled to an output terminal of the log-likelihood ratio buffer 23 and an output terminal of the convolutional encoder 15. A multiplexing output terminal of the multiplexer 21 is coupled to the input terminal of the second convolutional decoder 142. Multiplexing input terminals of the multiplexer 22 are coupled to the output terminal of the second convolutional decoder 142 and the output terminal of the FIFO buffer 24. A multiplexing output terminal of the multiplexer 22 is coupled to the input terminal of the second deinterleaver 144. Both of the multiplexers 21 and 22 are controlled by a block decoding flag RS_flag, where the block decoding flag RS_flag may be generated by the first block decoder 126. The block decoding flag RS_flag may represent a decoding status corresponding to the data block or the specific data length (e.g., a byte). The block decoding flag RS_flag may be binary.

For example, a value of the block decoding flag RS_flag can be expressed by a notation either be R or E (those skilled in the art may assign/correspond the notation R to one of 0 and 1, and assign/correspond the notation E to the other, e.g., the notation R may be corresponding to 0, and the notation E may be corresponding to 1.) When the block decoding flag RS_flag is R, it may represent that the first block decoder 126 can successfully decode (including the error correction) the data within the data block or the specific data length (e.g., the byte). Otherwise, when the block decoding flag RS_flag is E, it represents that the first block decoder 126 cannot successfully decode (including error correction) the data in the data block or the specific data length (e.g., the byte), which implies that the data in the data block or the specific data length may need to be erased. Furthermore, in an embodiment, when the block decoding flag RS_flag_i corresponding to every bit within the byte i is E, it represents that the first block decoder 12 detects that error occurs in byte i but it cannot correct the data in the byte i successfully (or needed to be erased). Otherwise, when the block decoding flag RS_flag_i corresponding to every bit of within the byte i is R, it represents that the first block decoder 12 can successfully decode or correct the error in byte i. For simplicity, the byte index i is omitted in FIG. 2.

In an embodiment, when the block decoding flag RS_flag is E (or when the block decoding flag RS_flag_i corresponding to the bits $b_{0,i}$-$b_{7,i}$ of the byte i is E), the multiplexer 21 transmits the log-likelihood ratios $LLR_{0,i}$-$LLR_{7,i}$ corresponding to the bytes $b_{0,i}$-$b_{7,i}$ to the second convolutional decoder 142. The second convolutional decoder 142 performs the second convolutional decoding operation on the log-likelihood ratios $LLR_{0,i}$-$LLR_{7,i}$, and generates the convolutional decoded data CV2_i corresponding to the byte i of the second convolutional decoding result CV2, in which the convolutional decoded data CV2_i comprises the second decoded bits $cb2_{0,i}$-$cb2_{7,i}$. Meanwhile, the FIFO buffer 24 may receive the first convolutional decoding result CV1' via the interleaver 11, and the convolutional decoded data CV1'_i corresponding to the byte i of the first convolutional decoding result CV1' can be temporarily aligned to the convolutional decoded data CV2_i via the FIFO buffer 24, in which the convolutional decoded data CV1'_i comprises the first decoded bits $cb1'_{0,i}$-$cb1'_{7,i}$. In other words, the first decoded bits $cb1'_{0,i}$-$cb1'_{7,i}$ can be temporarily aligned to the decoded bits $cb2_{0,i}$-$cb2_{7,i}$ via the FIFO buffer 24. The comparator 16 may compare the first decoded bits $cb1'_{0,i}$-$cb1'_{7,i}$ with the decoded bits $cb2_{0,i}$-$cb2_{7,i}$, and output the comparing sub-results fg_i_0-fg_i_7 corresponding to the bits $b_{0,i}$-$b_{7,i}$ of the byte i.

On the other hand, when the block decoding flag RS_flags are R (or when the block decoding flag RS_flag_i are corresponding to the bits $b_{0,i}$-$b_{7,i}$ of byte i is R), the multiplexer 22 delivers the convolutional decoded data CV1'_i (i.e., the decoded bits $cb1'_{0,i}$-$cb1'_{7,i}$) corresponding to byte i of the first convolutional decoding result CV1' to the second deinterleaver 144 and bypasses the second convolutional decoder 142. At this time (when the block decoding flag RS_flag is R), the decoded bits $cb2_{0,i}$-$cb2_{7,i}$ should be equal to the decoded bits $cb1'_{0,i}$-$cb1'7,i$.

In an embodiment, when the block decoding flag RS_flag is E, the second convolutional decoder 142 may be enabled. When the block decoding flag RS_flag is R, the second convolutional decoder 142 may be disabled, and the comparing sub-results fg_i_0-fg_i_7 corresponding to the bits $b_0$-$b_{7,i}$ of byte i would be set to 0, so as to represent that the decoded bits $cb2_{0,i}$-$cb2_{7,i}$ are equal to the decoded bits $cb1'_{0,i}$-$cb1'_{7,i}$. For simplicity, the indices of bits and bytes are omitted in FIG. 2.

As shown above, the iterative decoding circuit 10 compares the first convolutional decoding result CV1' with the second convolutional decoding result CV2 via the comparator 16, and generates the comparing result fg. The second block decoder 146 obtains the erasure address information ESI needed for performing block decoding operation according to the comparing result fg, such that the capability of error correction is improved. Compared to the prior art, there is no need to utilize the Soft-Output Viterbi algorithm (SOVA) decoder, such that the area of the circuit is reduced. In addition, the erasure address information ESI is provided to improve the capability of error correction of the block decoder (Reed-Solomon decoder) at the same time. Details of performing block decoding of the second block decoder 146 (Reed-Solomon decoder) according to the erasure address information ESI are known by one skilled in the art and not narrated herein for brevity.

Figure 3:
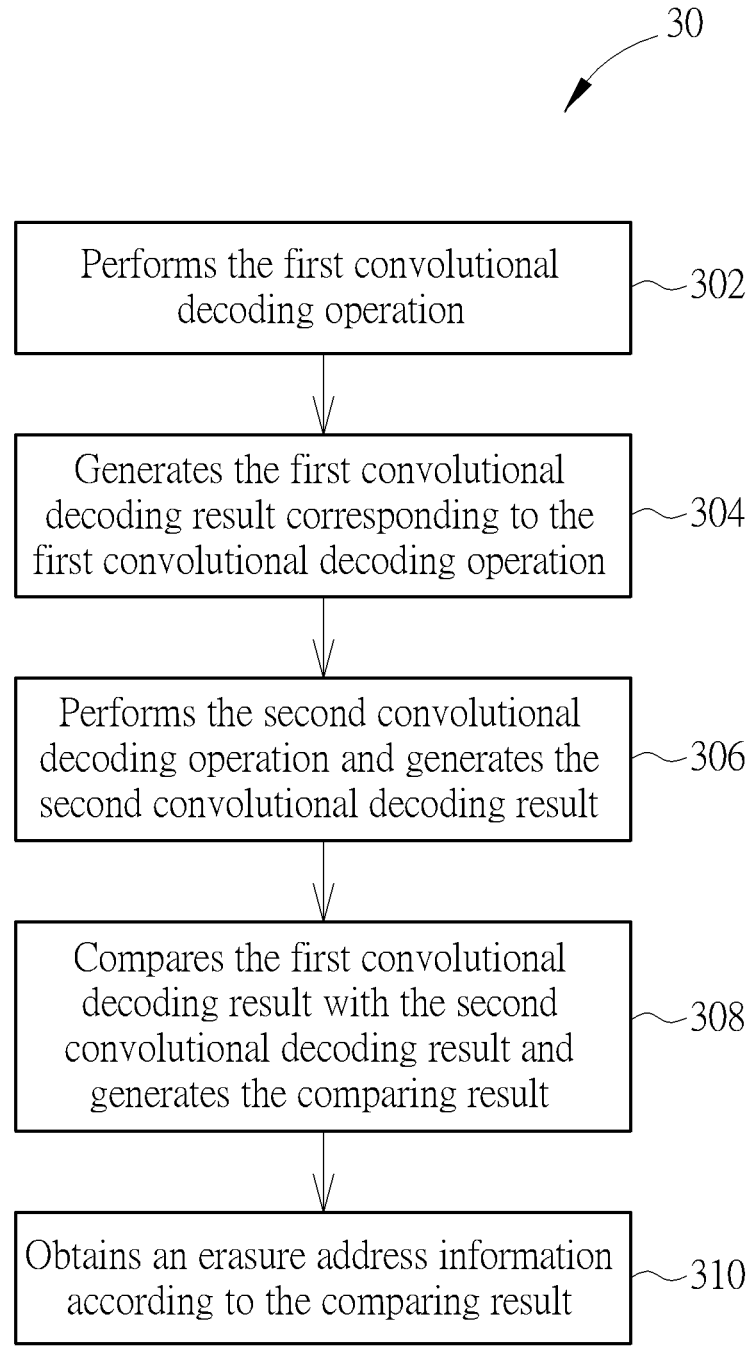
FIG. 3 is a flowchart of a decoding process according to an embodiment of the present disclosure.

Referring to FIG. 1 and FIG. 3, the operation of the iterative decoding circuit 10 could be summarized as a decoding process 30. FIG. 3 illustrated a flowchart of the decoding process 30. The decoding process 30 comprises Step 302~310. In Step 302, the first convolutional decoder 122 performs the first convolutional decoding operation. In Step 304, the first convolutional decoder 122 generates the first convolutional decoding result corresponding to the first convolutional decoding operation. In Step 306, the second convolutional decoder 142 performs the second convolutional decoding operation and generates the second convolutional decoding result. In Step 308, the comparator 16 compares the first convolutional decoding result with the second convolutional decoding result and generates the comparing result. In Step 310, the second block decoder 146 obtains an erasure address information according to the comparing result.

In summary, the comparator compares the first convolutional decoding result with the second convolutional decoding result and generates the comparing result to obtain the erasure address information for the block decoding operation according to the comparing result of the present invention. Compared with the prior art, the circuit area corresponding to the present disclosure is smaller, and the capability of error correction of the block decoder could be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An iterative decoding circuit, comprising:
a first concatenated decoding circuit, comprising:
   a first convolutional decoder, a first deinterleaver, and a first block decoder, wherein the first convolutional decoder is configured to perform a first convolutional decoding operation;
a second concatenated decoding circuit, coupled to the first concatenated decoding circuit, the second concatenated decoding circuit comprising:
   a second convolutional decoder, a second deinterleaver, and a second block decoder, wherein the second convolutional decoder is configured to perform a second convolutional decoding operation;
a comparator, receiving a first convolutional decoding result corresponding to the first convolutional decoding operation and a second convolutional decoding result of the second convolutional decoding operation, configured to compare the first convolutional decoding result with the second convolutional decoding result to generate a comparing result;
an interleaver, coupled to the first block decoder; and
a convolutional encoder, coupled between the interleaver and the second convolutional decoder;
wherein the second block decoder obtains an erasure address information according to the comparing result;
wherein a first comparing input terminal of the comparator is coupled to an output terminal of the interleaver, so as to receive the first convolutional decoding result.

2. The iterative decoding circuit of claim 1, comprising:
a log-likelihood ratio buffer, configured to buffer a plurality of log-likelihood ratios corresponding to a plurality of bits.

3. The iterative decoding circuit of claim 2, comprising:
a first multiplexer, controlled by a block decoding flag, the first multiplexer comprising:
   a first multiplexing input terminal, coupled to an output terminal of the log-likelihood ratio buffer;
   a second multiplexing input terminal, coupled to an output terminal of the convolutional encoder; and
   a multiplexing output terminal, coupled to the second convolutional decoder;
wherein the block decoding flag is generated by the first block decoder.

4. The iterative decoding circuit of claim 1, comprising:
a first-in-first-out (FIFO) buffer, coupled between the first comparing input terminal and the output terminal of the interleaver.

5. The iterative decoding circuit of claim 4, comprising:
a second multiplexer, controlled by a block decoding flag, the second multiplexer comprising:
   a third multiplexing input terminal, coupled to the output terminal of the second convolutional decoder;
   a fourth multiplexing input terminal, coupled to the output terminal of the FIFO buffer; and
   an output terminal of the multiplexer, coupled to the second deinterleaver;
wherein the block decoding flag is generated by the first block decoder.

6. The iterative decoding circuit of claim 1, wherein a second input terminal of the comparator is coupled to an output terminal of the second convolutional decoder, to receive the second convolutional decoding result.

7. The iterative decoding circuit of claim 1, wherein the second deinterleaver receives the second convolutional decoding result and the comparing result, and the comparing result is transmitted to the second block decoder via the second deinterleaver.

8. The iterative decoding circuit of claim 1, wherein the first convolutional decoding result comprises a plurality of first decoded bits corresponding to a data block, the second convolutional decoding result comprises a plurality of second decoded bits corresponding to the data block, the comparator compares the plurality of first decoding bits with the plurality of second decoding bits to obtain a plurality of comparing sub-results corresponding to the data block, and the second block decoder obtains the erasure address information according to the plurality of comparing sub-results.

9. The iterative decoding circuit of claim 1, wherein the first convolutional decoder or the second convolutional decoder is a Viterbi decoder, and the first block decoder or the second block decoder is a Reed-Solomon decoder.

10. The iterative decoding circuit of claim 1, wherein the second convolutional decoder obtains a plurality of log-likelihood ratios corresponding to a plurality of bits, and the first block decoder generates a block decoding flag, when the block decoding flag represents that a data within in a data block needed to be erased, the second convolutional decoder generates the second convolutional decoding result according to the plurality of log-likelihood ratios.

11. A decoding method, applied to an iterative decoding circuit, the decoding method comprising:
performing a first convolutional decoding operation;
generating a first convolutional decoding result corresponding to the first convolutional decoding operation;
performing a second convolutional decoding operation, and generating a second convolutional decoding result;
comparing the first convolutional decoding result with the second convolutional decoding result to generate a comparing result; and
obtaining an erasure address information according to the comparing result;
wherein the step of generating the second convolutional decoding result comprises:
obtaining a plurality of log-likelihood ratios corresponding to a plurality of bits;
obtaining a block decoding flag; and
when the block decoding flag represents that a data within in a data block needed to be erased, executing the second convolutional decoding operation on the log-likelihood ratios to generate the second convolutional decoding result.

12. The decoding method of claim 11, wherein the first convolutional decoding result comprises the plurality of the first convolutional decoding result corresponding to a plurality of data blocks, the second convolutional decoding result comprises the plurality of second convolutional decoding result corresponding to the plurality of data blocks, a comparator compares the plurality of first convolutional decoding result with the plurality of second convolutional decoding result, to obtain a plurality of sub-results corresponding to the data block; the second block decoder obtains the erasure address information according to the plurality of comparing sub-results.

13. An iterative decoding circuit, comprising:
a first concatenated decoding circuit, comprising:
a first convolutional decoder, a first deinterleaver, and a first block decoder, wherein the first convolutional decoder is configured to perform a first convolutional decoding operation;
a second concatenated decoding circuit, coupled to the first concatenated decoding circuit, the second concatenated decoding circuit comprising:
a second convolutional decoder, a second deinterleaver, and a second block decoder, wherein the second convolutional decoder is configured to perform a second convolutional decoding operation; and
a comparator, receiving a first convolutional decoding result corresponding to the first convolutional decoding operation and a second convolutional decoding result of the second convolutional decoding operation, configured to compare the first convolutional decoding result with the second convolutional decoding result to generate a comparing result;
wherein the second deinterleaver receives the second convolutional decoding result and the comparing result, and the comparing result is transmitted to the second block decoder via the second deinterleaver.

14. The iterative decoding circuit of claim 13, comprising:
an interleaver, coupled to the first block decoder; and
a convolutional encoder, coupled between the interleaver and the second convolutional decoder.

15. The iterative decoding circuit of claim 14, comprising:
a log-likelihood ratio buffer, configured to buffer a plurality of log-likelihood ratios corresponding to a plurality of bits.

16. The iterative decoding circuit of claim 15, comprising:
a first multiplexer, controlled by a block decoding flag, the first multiplexer comprising:
a first multiplexing input terminal, coupled to an output terminal of the log-likelihood ratio buffer;
a second multiplexing input terminal, coupled to an output terminal of the convolutional encoder; and
a multiplexing output terminal, coupled to the second convolutional decoder;
wherein the block decoding flag is generated by the first block decoder.

17. The iterative decoding circuit of claim 13, wherein a second input terminal of the comparator is coupled to an output terminal of the second convolutional decoder, to receive the second convolutional decoding result.

18. The iterative decoding circuit of claim 13, wherein the first convolutional decoding result comprises a plurality of first decoded bits corresponding to a data block, the second convolutional decoding result comprises a plurality of second decoded bits corresponding to the data block, the comparator compares the plurality of first decoding bits with the plurality of second decoding bits to obtain a plurality of comparing sub-results corresponding to the data block, and the second block decoder obtains the erasure address information according to the plurality of comparing sub-results.

19. The iterative decoding circuit of claim 13, wherein the first convolutional decoder or the second convolutional decoder is a Viterbi decoder, and the first block decoder or the second block decoder is a Reed-Solomon decoder.

20. The iterative decoding circuit of claim 13, wherein the second convolutional decoder obtains a plurality of log-likelihood ratios corresponding to a plurality of bits, and the first block decoder generates a block decoding flag, when the block decoding flag represents that a data within in a data block needed to be erased, the second convolutional decoder generates the second convolutional decoding result according to the plurality of log-likelihood ratios.

* * * * *

UNITED STATES PATENT AND TRADEMARK OFFICE
CERTIFICATE OF CORRECTION

PATENT NO. : 11,005,502 B2  
APPLICATION NO. : 16/780919  
DATED : May 11, 2021  
INVENTOR(S) : Che-Chia Chang Page 1 of 1

It is certified that error appears in the above-identified patent and that said Letters Patent is hereby corrected as shown below:

On the Title Page

Item (30), correct the application number of the TW priority application from "10812942.9" to --108129429--.

Signed and Sealed this  
Twenty-second Day of June, 2021

Drew Hirshfeld  
*Performing the Functions and Duties of the*  
*Under Secretary of Commerce for Intellectual Property and*  
*Director of the United States Patent and Trademark Office*